United States Patent [19]

Kman et al.

[11] Patent Number: 5,548,486
[45] Date of Patent: Aug. 20, 1996

[54] PINNED MODULE

[75] Inventors: Stephen J. Kman, Port Crane; John A. Stubecki, Nichols; William R. Sondej, Vestal, all of N.Y.

[73] Assignee: International Business Machines Corporation, Endicott, N.Y.

[21] Appl. No.: 185,182

[22] Filed: Jan. 21, 1994

[51] Int. Cl.$^6$ .............................. H01R 23/68; H01R 9/09
[52] U.S. Cl. .......................... 361/791; 361/744; 361/784; 361/773; 361/774; 361/776; 361/789; 361/790; 439/74; 439/75; 439/82; 439/84; 439/751
[58] Field of Search ...................... 174/262, 265, 174/266, 267; 361/744, 484, 785, 789, 790, 791, 803, 728, 735, 772–774, 776, 785–791; 439/45, 74, 75, 84, 870, 82, 751; 257/652, 653, 697, 698, 659, 723, 724, 780; 324/538; 411/500, 504, 507, 508, 509, 510

[56] References Cited

U.S. PATENT DOCUMENTS

| | | |
|---|---|---|
| 2,611,010 | 9/1952 | Sass et al. . |
| 2,979,600 | 4/1961 | Rangabe ............................ 439/870 |
| 3,281,923 | 11/1966 | Best et al. . |
| 3,541,496 | 11/1970 | Castellani ............................ 439/870 |
| 3,545,080 | 12/1970 | Evans ............................ 439/82 |
| 3,880,486 | 4/1975 | Avakian ............................ 439/75 |
| 4,034,468 | 7/1977 | Koopman . |
| 4,066,326 | 1/1978 | Lovendusky ............................ 439/751 |
| 4,072,816 | 2/1978 | Gedney et al. . |
| 4,082,394 | 4/1978 | Gedney et al. . |
| 4,120,843 | 10/1978 | Ameen et al. . |
| 4,191,938 | 3/1980 | Gow, 3rd et al. . |
| 4,202,007 | 5/1980 | Dougherty et al. . |
| 4,233,620 | 11/1980 | Darrow et al. . |
| 4,265,775 | 5/1981 | Aakalu et al. . |
| 4,274,124 | 6/1981 | Feinberg et al. . |
| 4,291,364 | 9/1981 | Andros et al. . |
| 4,415,025 | 11/1983 | Horvath . |
| 4,446,505 | 5/1984 | Long et al. ............................ 361/785 |
| 4,550,493 | 11/1985 | Darrow et al. . |
| 4,601,424 | 7/1986 | Adwalpalker et al. . |
| 4,676,426 | 6/1987 | Darrow et al. . |
| 4,682,270 | 7/1987 | Whitehead et al. . |
| 4,690,833 | 9/1987 | Donson et al. . |
| 4,724,472 | 2/1988 | Sugimoto et al. . |

(List continued on next page.)

FOREIGN PATENT DOCUMENTS

| | | | |
|---|---|---|---|
| 0236186 | 9/1987 | European Pat. Off. ............ 439/751 |
| 893034835 | 10/1989 | European Pat. Off. . |
| 2541222 | 7/1976 | Germany ............................ 439/751 |
| 61-10263 | 1/1986 | Japan ............................ 357/71 |
| 2-155176 | 6/1990 | Japan ............................ 439/84 |
| 3-263771 | 11/1991 | Japan ............................ 439/82 |

OTHER PUBLICATIONS

IBM Disclosure Bulletin "Weld Pin Through–hole Connection for Printed–Circuit Boards" by C. J. Aug, vol. 15, No. 8, Jan. 1973 (pp. 2492).

Mill–Max MFG. Corp. "Printed Circuit Pins" Pub. Date 1985.

Berg Electronics Brochure "Bery Compliant Press–Fit Edge Card Connector" Data Sheet 7020, Dec. 1982.

DuPont Conpliant Press–Fit Pins ".64 mm (0.025in) Square Pins Hold Fast Without Solder; Allow Wide Hole Tolerance" Data Sheet 7001/7010, Jun. 1985.

(List continued on next page.)

*Primary Examiner*—Donald A. Sparks
*Attorney, Agent, or Firm*—Calfee, Halter & Griswold

[57] ABSTRACT

An electrical connection pin blank having at least one compliant section is affixed to a first circuit board by compressive deformation in such a way that the compliant section of the pin blank projects outwardly from the surface of the first circuit board. The end of the pin projecting from the first circuit board is then inserted into a corresponding opening in a second circuit board and the two boards brought together until the second circuit board is firmly affixed to the complaint section of the pin by compliant pin connection.

11 Claims, 4 Drawing Sheets

U.S. PATENT DOCUMENTS

| | | |
|---|---|---|
| 4,741,100 | 5/1988 | Pierson . |
| 4,764,848 | 8/1988 | Simpson et al. . |
| 4,780,371 | 10/1988 | Joseph et al. . |
| 4,791,075 | 12/1988 | Lin .......................................... 361/791 |
| 4,803,595 | 2/1989 | Kraus et al. . |
| 4,813,130 | 3/1989 | Fey et al. . |
| 4,821,142 | 4/1989 | Ushifusa et al. . |
| 4,825,284 | 4/1989 | Soga et al. . |
| 4,827,328 | 5/1989 | Ozawa et al. . |
| 4,878,861 | 11/1989 | Kendall et al. ........................ 439/751 |
| 4,883,744 | 11/1989 | Feilchenfeld et al. . |
| 4,889,496 | 12/1989 | Neidich . |
| 4,916,259 | 4/1990 | Charsky et al. . |
| 4,969,259 | 11/1990 | Macek et al. . |
| 4,988,646 | 1/1991 | Mukherjee . |
| 5,002,507 | 3/1991 | Sitzler . |
| 5,048,178 | 9/1991 | Bindra et al. . |
| 5,050,296 | 9/1991 | Emerick et al. ......................... 29/845 |
| 5,065,227 | 11/1991 | Frankeny et al. . |
| 5,082,460 | 1/1992 | Legrady .................................. 439/84 |
| 5,102,352 | 4/1992 | Arisaka ................................... 439/45 |
| 5,110,664 | 5/1992 | Nakanishi et al. . |
| 5,159,535 | 10/1992 | Desai et al. . |
| 5,257,165 | 10/1993 | Chiang .................................... 439/45 |

OTHER PUBLICATIONS

IBM Disclosure Bulletin "Segmented Modular Complinant Pin Carrier For Large Pinless Headers" vol. 36, No. 04, Apr. 1993

Research Disclosure, May 1990, No. 313, Kenneth Mason Publications Ltd., England.

IBM Technical Disclosure Bulletin, vol. 18, No. 5, pp. 1440–1441.

IBM Technical Disclosure Bulletin, vol. 20, No. 8, pp. 3090–3091.

IBM Techincal Disclosure Bulleting, vol. 33, No. 2, pp. 15–16.

IBM Technical Disclosure Bulletin, vol. 10, No. 12, May 1968, pp. 1977–1968.

IBM Technical Disclosure Bulletin, vol. 27, No. 3, Aug. 1984, pp. 1499–1501.

IBM Technical Disclosure Bulletin, vol. 21, No. 12, May 1979, pp. 4796–4797.

Over Molded Pad Array Carrier (OMPAC), "A New Kid on the Block", Jim Sloan et al., Rev. Feb. 10, 1993. Motorola, Inc.

IBM Technical Disclosure Bulletin, vol. 15, No. 8, Jan. 1973, p. 2492.

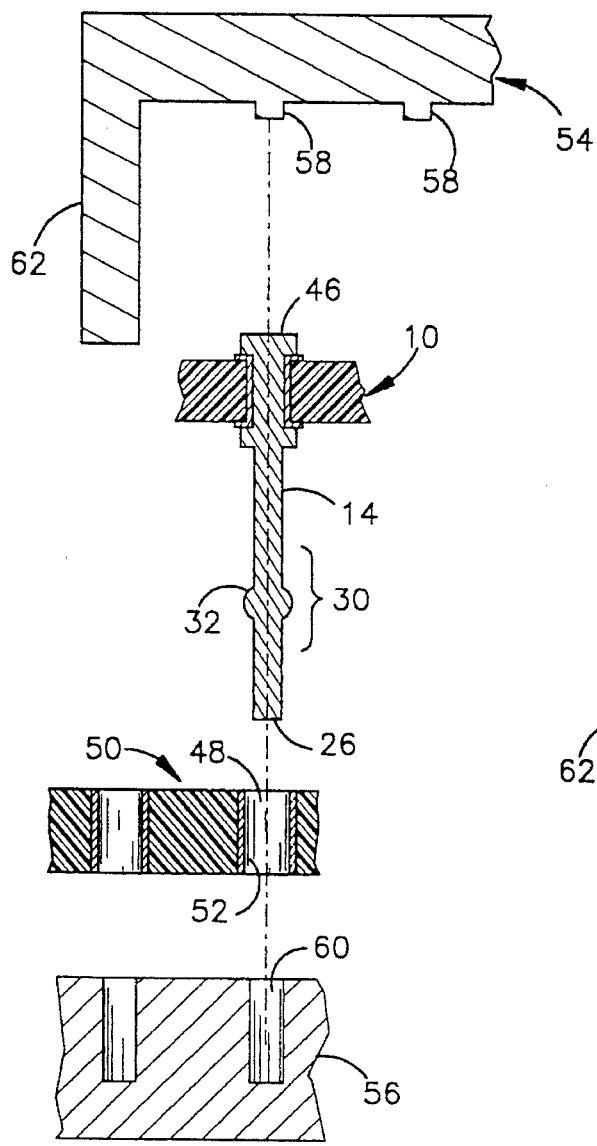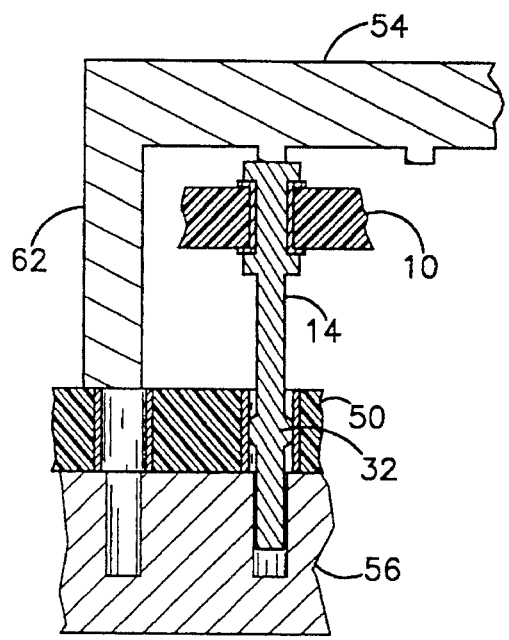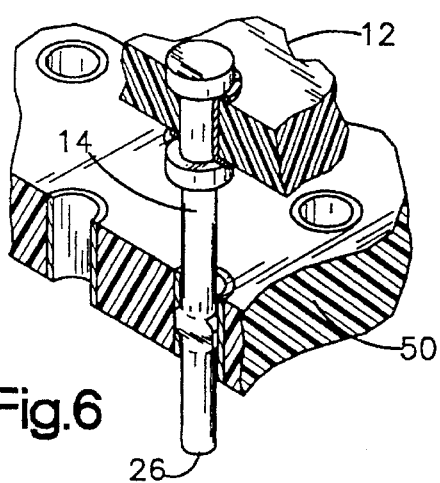
Fig.4　　　　Fig.5
Fig.6

PINNED MODULE

BACKGROUND OF THE INVENTION

The present invention relates to a novel pinned module and a method for making the same.

In the manufacture of printed circuit boards and similar electrical devices, it is desirable to make connections to the device as quickly and easily as possible. One technique for making this connection is to employ pins which are mechanically and sometimes electrically connected to the device.

Many techniques are known for affixing electrical connection pins to circuit boards and the like devices. One well known way is to provide the circuit board or device with an opening and to provide the pin with a compliant section having a size compatible with the opening such that when the compliant section of the pin is inserted into the opening, it coacts with the walls of the opening to maintain the pin affixed to the device or board. See U.S. Pat. No. 4,969,259, the disclosure of which is incorporated herein by reference. For convenience, this technique of affixing a pin to a substrate using a compliant section of the pin to interact with the walls of an opening in the substrate shall be referred to hereinafter as "compliant pin connection."

Another well known method for connecting pins to circuit boards and the like devices uses non-compliant pins. In this technique, a pin blank is inserted into a hole in the board or other device and the blank is subjected to compression along its longitudinal axis. As a result, the portions of the pin blank adjacent the two sides or surfaces of the board deform through compressive stress to form bulges which securely lock the pin in place. For convenience, techniques for affixing pins in this manner will be referred to hereinafter as "compressive deformation connection."

In the design of complicated electronic components, it is not uncommon to arrange circuit boards and other like devices in stacked relation with numerous electrical connections being made between the different boards. Typically this is done by providing a first circuit board with pins of either the compliant or non-compliant types, moving a second circuit board into position so that the pins projecting from the first circuit board engage corresponding positions in the second circuit board and then soldering the pins to the second circuit board to lock them in place.

Although this procedure works well, it is disadvantageous because it employs soldering operations, which are inherently time consuming, messy and expensive.

In order to overcome this disadvantage, it has been proposed to affix stacked circuit boards together by using electrical connection pins in which both boards are secured to the same pin by compliant pin connection. See, for example, U.S. Pat. No. 4,446,505 and U.S. Pat. No. 4,889,496, the disclosures of which are incorporated herein by reference. However, in these cases, either the mechanical/electrical connection made with at least some of the pins in one or both boards is not as good as desired or the procedures are complicated and expensive due to the use of pin blanks of esoteric structure, special mechanical manipulations, or both.

Accordingly, it is an object of the present invention to provide a novel technique for forming electrical connections between two or more stacked printed circuit boards by a simple and straightforward manner which provides excellent electrical/mechanical connection for all connections.

In addition, it is a further object of the present invention to provide a novel circuit board or module for use in this technique.

A still further object of this invention is to provide a completed assembly of two or more stacked printed circuit boards or devices which is made using this module.

In addition, it is a still further object of the present invention to provide a method of affixing pin blanks to electrical substrates in order to make the modules of the present invention.

Moreover, it is a still another object of this invention to provide a novel hammer or anvil for use in affixing pin blanks to substrates in accordance with this method.

SUMMARY OF THE INVENTION

These and other objects are accomplished by the present invention in accordance with which an electrical connection pin blank having at least one compliant section is affixed to a first circuit board by compressive deformation in such a way that the compliant section of the pin blank projects outwardly from the surface of the first circuit board. The end of the pin projecting from the first circuit board is then inserted into a corresponding opening in a second circuit board and the two boards brought together until the second circuit board is firmly affixed to the complaint section of the pin by compliant pin connection.

By this means, both the first and the second circuit boards are securely connected together, both mechanically and electrically, even when many pins are involved. Moreover, because soldering is avoided the attendant disadvantages of soldering are also avoided. Furthermore, because the pin blanks employed are of conventional structure, and also because only simply mechanical movements are needed for each formation step, the manufacturing method is simple, easy and inexpensive to carry out.

In accordance with a further aspect of the invention, a novel hammer for affixing pin blanks to a substrate by compressive deformation is provided, the hammer defining holes for receiving the projecting ends of a plurality of pin blanks, these projecting ends including compliant pin sections, the holes in the hammer being so shaped that they can receive the projecting ends of the pin blanks including their compliant sections. By this means attachment of pins to a first circuit board by compressive deformation can be easily accomplished, even though the pins include compliant sections that would prevent them from being used in ordinary hammers.

BRIEF DESCRIPTION OF THE DRAWINGS

The present invention is more thoroughly illustrated in the following drawings wherein:

FIG. 4 is another exploded schematic view illustrating how the module of FIG. 3 is affixed to a second circuit board by compliant pin connection; and FIG. 5 is a schematic view similar to FIG. 4 showing the parts of the forming machine in a closed position to form an assembly in accordance with the present invention; and FIG. 6 is a partial isometric view illustrating the completed assembly produced by the process illustrated in FIG. 4 and 5.

DETAILED DESCRIPTION

Figure 1:
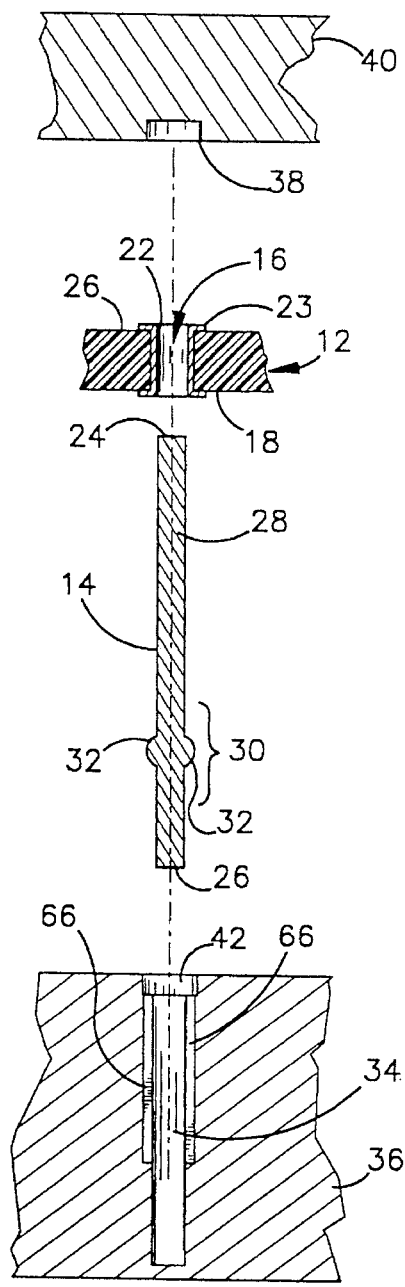
FIG. 1 is an exploded schematic view, in cross section, illustrating how a pin blank is affixed to a first circuit board by compressive deformation in accordance with the present invention, with the parts and the hammers used for this forming process being in a retracted position.
Figure 2:
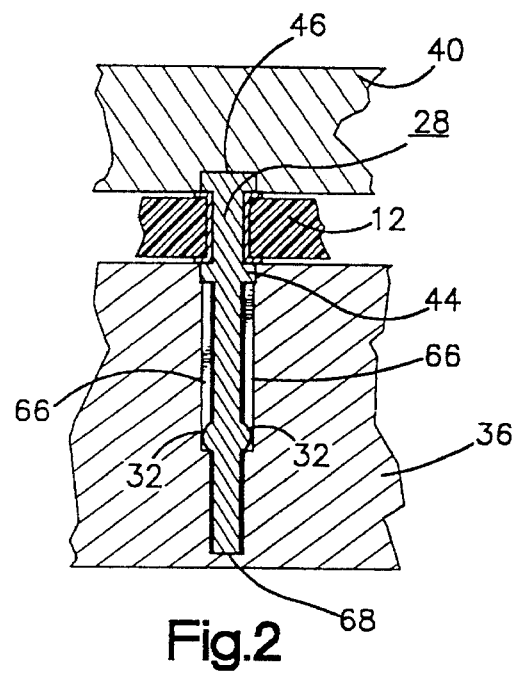
FIG. 2 is a view similar to FIG. 1 showing the hammers in a closed position with the pin being received in and affixed to the first circuit board.
Figure 3:
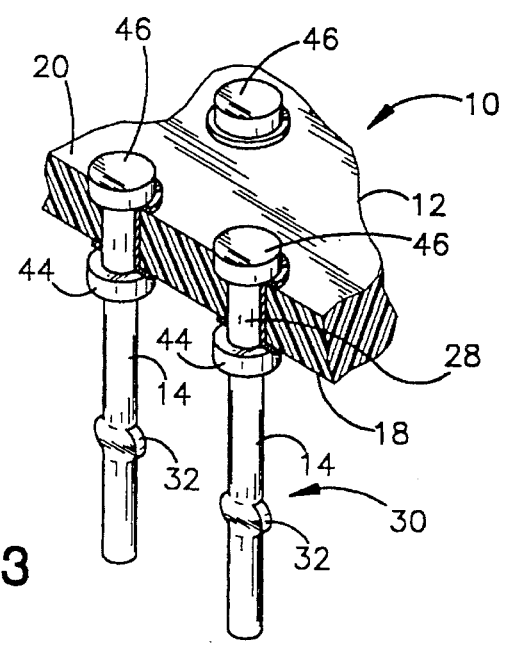
FIG. 3 is an isometric view illustrating the module produced by the technique illustrated in FIGS. 1 and 2.

Referring to FIGS. 1 to 3, an electrical module generally indicated at 10 (FIG. 3) is formed from a substrate 12 and a pin blank 14. In the embodiment shown, substrate 12 is a printed circuit board and is composed of a dielectric material such as ceramic, fiberglass-reinforced epoxy such as FR4, etc., which contains one or more electrically conductive paths (not shown) therein. Substrate 12 defines one or more holes 16 therein which pass all the way through the substrate from a first surface 18 thereof to a second surface 20 thereof. In the embodiment shown, hole 16 is a plated-through-hole, meaning that the surfaces of hole 16 carry a coating of an electrically conductive material 22 which extends all the way through the hole from first surface 18 of the substrate to second surface 20 and extends outwardly from the center of the hole by a small distance on these surfaces to form pads 23 as shown in FIG. 1. In the particular embodiment shown, the electrically conductive material 22 of the plated-through-hole is electrically connected to an electrically conductive path (not shown) in the substrate.

As further shown in FIG. 1, pin blank 14 comprises a generally elongated member which defines a first end 24 and a second end 26. The body of pin blank 14 near first end 24 defines a substrate-engaging section 28 and, in a location spaced from substrate-engaging section 28, a first compliant section generally indicated at 30.

In the particular embodiment shown, first compliant section 30 includes protrusions 32, which are formed by swaging and which extend outwardly from the center line of pin blank 14 by a distance greater than the radius of the pin blank in the remainder of the pin blank body. As discussed more fully below, the shape and size of protrusions 32 are selected so that these protrusions will cooperate with the walls of openings in a second circuit board to which the module 10 is to be attached.

In order to form the module of FIG. 3, pin blank 14 is arranged to register with hole 16 in printed circuit board 12. In addition, printed circuit board 12 and pin blank 14 are also arranged to register with a pin blank receiving hole 34 in a lower hammer 36 as well as a bulge cavity 38 in an upper hammer 40, these hammers being part of a machine (not shown) for attaching pin blanks to boards by compressive deformation. Part of pin blank receiving hole 34 in lower hammer 36 defines its own bulge cavity 42 having a shape similar to bulge cavity 38 in upper hammer 40. As used herein, "upper" and "lower" refer to the position as shown in the FIG. 1, but physically they can be reversed or even spaced laterally or other direction rather than vertically.

With the elements arranged in this manner, lower hammer 36 and upper hammer 40 are moved together in the axial direction, i.e., in the direction of the longitudinal axis of pin blank 14. This causes the first end 24 of the pin blank to be inserted into hole 16 of board 12 and then for the pin blank to be moved all the way into hole 16 until substrate-engaging section 28 of the pin blank aligns with the body of the board and the end 24 of the pin protrudes out of hole 16 just past pads 23 of electrically conductive material 22. At the same time, movement of the hammers together also causes end 26 and compliant section 30 of pin 14 to be received in pin blank receiving hole 34 of lower hammer 36.

Movement of lower hammer 36 and upper hammer 40 together is continued until they reach a predetermined distance apart, this distance being, in the particular embodiment shown, the thickness of electrical substrate 12 including pads 23 of electrically conductive material 22. As will be appreciated by those skilled in the art, movement of the upper and lower hammers together in this manner causes a compressive force to be exerted upon the body of pin blank 14 along its longitudinal axis. This compressive force in turn causes a compressive deformation, i.e., plastic deformation, of those portions of the substrate-engaging section 28 of the pin blank immediately below and above the first and second surfaces, respectively, of printed circuit board 12. This plastic deformation, in turn, causes bulges 44 and 46 to form in the body of the pin blank, these bulges being formed by the material of pin blank 14 filling bulge cavities 38 and 42 of upper and lower hammers 40 and 36, respectively. As well known to those skilled in the art, bulges 44 and 46 act to sandwich or hold board 12 therebetween, thereby firmly and securely affixing the pin blank to the board, pin blank 14 now being referred to simply as a pin. Lower hammer 36 and upper hammer 40 are then moved to a retracted position, thereby producing a completed module 10 in accordance with the present invention.

Although FIGS. 1 and 2 illustrate only a single pin blank being affixed to printed circuit board 12, in actual practice there will normally be multiple pin blanks affixed to multiple holes in the substrate. By this technique, a module is provided which, as illustrated in FIG. 3, defines a plurality, or array, of pins 14, each having a compliant section projecting from the first surface 18 of the board for subsequent connection of module 10 to another printed circuit board or other device by compliant pin connection, as more fully described below.

FIGS. 4, 5 and 6 illustrate how the inventive module 10 prepared as described above can be connected to another circuit board or other device (known in the art by various terms such as "carrier," "mother board," "planar", etc.) for forming a completed assembly of stacked boards or devices. Referring to FIG. 4, module 10 is arranged so that second end 26 of pin 14 registers with opening 48 in a second electrical substrate 50, which in the embodiment shown is also a printed circuit board. Opening 48 in printed circuit board 50 has a size compatible with compliant section 30 of pin 14 so that when this section is inserted into opening 48, protrusions 32 in the compliant section 30 firmly affix pin 14 to circuit board 50 by compliant pin connection. In the particular embodiment shown, the walls of opening 48 in board 50 are plated through holes provided with a coating 52 of an electrically conductive material for providing electrical connection to pin 14 as well as mechanical connection. Printed circuit board 50 also includes an electrically conductive path (not shown) connected to the electrically conductive material 52 in hole 48 for electrical connection of pin 14 to other elements on printed circuit board 50.

With pin 14 arranged in registration with hole 48 of printed circuit 50, module 10 and circuit board 50 are brought together to insert pin 14 into hole 48 of the circuit board. This operation is accomplished in the embodiment shown by means of a press 54 and a mounting plate 56. Press 54 includes projections 58 for engaging the bulge 46 of pin 14, while mounting plate 56 defines holes 60 for receiving the portion of the body of pin 14 extending out of the bottom of the second printed circuit when module 10 and board 50 are brought together for their final positioning.

As illustrated in FIG. 5, mounting plate 56 and press 54 are brought together until stopped by a suitable stop 62 which is so arranged that converging movement of the press and mounting plate is stopped when protrusions 32 of pin 14 align with the axial center of hole 48. As will be appreciated by those skilled in the art, suitable spacer elements (not shown) may also be provided to insure that module 10 and board 50 remain spaced apart by a predetermined distance as press 54 and mounting plate 56 are moved together. In any event, insertion of compliant section 30 of pin 14 into hole 48 and convergence of press 54 and mounting plate 56 in the manner described above causes compliant section 30 of pin 14 and the walls of hole 48 to be firmly affixed together, thereby creating a secure mechanical and electrical bond in accordance with known compliant pin connection techniques. Press 54 and mounting plate 56 are then withdrawn from one another to form a completed assembly 64 as illustrated in FIG. 6.

As shown in FIG. 6, completed assembly 64 comprises a first circuit board 12 and second circuit board 50 which are securely affixed to one another, both mechanically and electrically by means of pin 14. In actual practice, many pins will normally be employed rather than the single pin illustrated in the figure so that numerous electrical and mechanical connections can be made, thereby making the connection between boards 12 and 50 even more secure.

From the foregoing, it can be seen that the present invention provides a simple and straightforward method for mechanically and electrically forming together multiple circuit boards in stacked relation without soldering. In particular, it can be seen that the procedure of the invention requires only simple movement of suitable anvils, hammers and other work pieces in the longitudinal direction, that is the direction aligning with the longitudinal axis of the pin blanks. Moreover, it can also be seen that the pin blanks used in the present invention are of simple design, not requiring involved mechanical steps to develop complex shapes or structures as in prior art systems. These features make the inventive technique for joining multiple circuit boards together inexpensive to carry out while at the same time providing secure electrical connections throughout the completed device.

Figure 7:
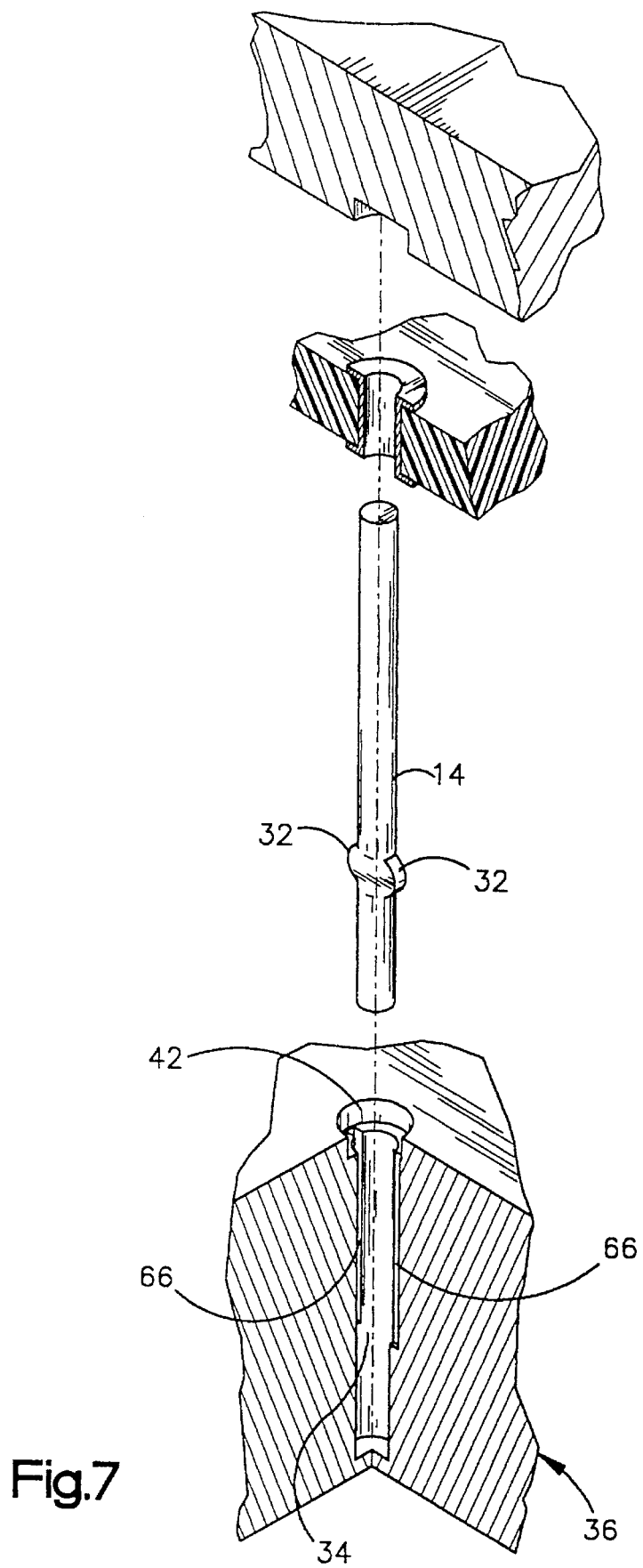
FIG. 7 is a view similar to FIG. 1 but shown in exploded isometric form for illustrating the details of the hammer of the present invention used to affix the pin blank to the first circuit board.

In accordance with another feature of the invention, a novel hammer or anvil is provided for inserting pin blank 14 into the substrate or circuit board 12 illustrated above. In this connection, an important feature of lower hammer 36 is that pin blank receiving hole 34 is sized and shaped to receive the lower end of pin 14 therein, even though this portion of pin 14 includes a compliant pin section 30. The structure to make this possible is more fully illustrated in FIG. 7. As shown in this figure, pin blank receiving hole 34 in lower hammer 36, in addition to including bulge cavity 42 as previously described, includes two grooves 66 axially arranged in the walls of pin blank receiving hole 34 to receive protrusions 32 of pin blank 14. As shown in FIG. 2, these grooves 66 extend downwardly by a distance sufficient to accommodate protrusions 32 when pin 14 is inserted in lower hammer 36 by sufficient distance so that the bottom 68 of pin engaging hole 34 engages the end 26 of the pin. By this means, lower hammer 36 can be used together with upper hammer 40 to cause compressive deformation of pin blank 14 thereby forming bulges 44 and 46 in the manner described above.

In accordance with another feature of the invention, a third electrical substrate or printed circuit board can be stacked with the assembly of two printed circuit boards shown in FIG. 6. In accordance with this embodiment of the invention, a pin is used which has two compliant sections, one near each of the two ends of the pin blank with the substrate-engaging section being located there-between. In this embodiment, it is preferable that the diameter of the substrate-engaging section be larger than the diameter of the pin in the other sections, and preferably at least as large as the largest cross-sectional dimension of the pin at the protrusions 32. With this configuration, a preformed pin can still be inserted into the hole 16 of board 12 and then moved therethrough until the substrate-engaging section 28 of the pin aligns with board 12. In this configuration, the pin blank is again subjected to compression along its longitudinal axis, but in this embodiment upper hammer 40 is provided with a pin blank receiving hole having essentially the same structure as pin blank receiving hole 34 in lower hammer 36. As a result, upper hammer 40 can receive the ends of the pins projecting from the upper surface 20 of board 12 in the same way lower hammer 36 receives the ends of the pins projecting downwardly from lower surface 18 of the board.

Figure 8:
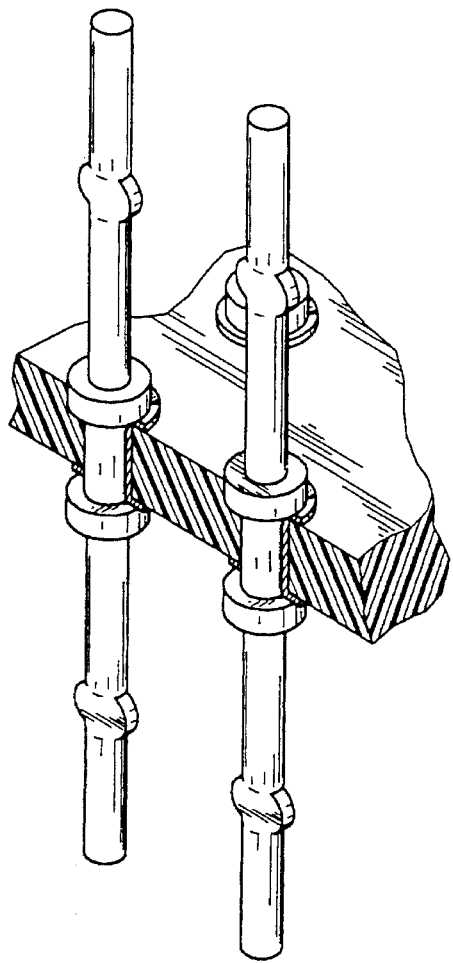
FIG. 8 is an isometric view similar to FIG. 3 but showing another embodiment of the present invention.
Figure 9:
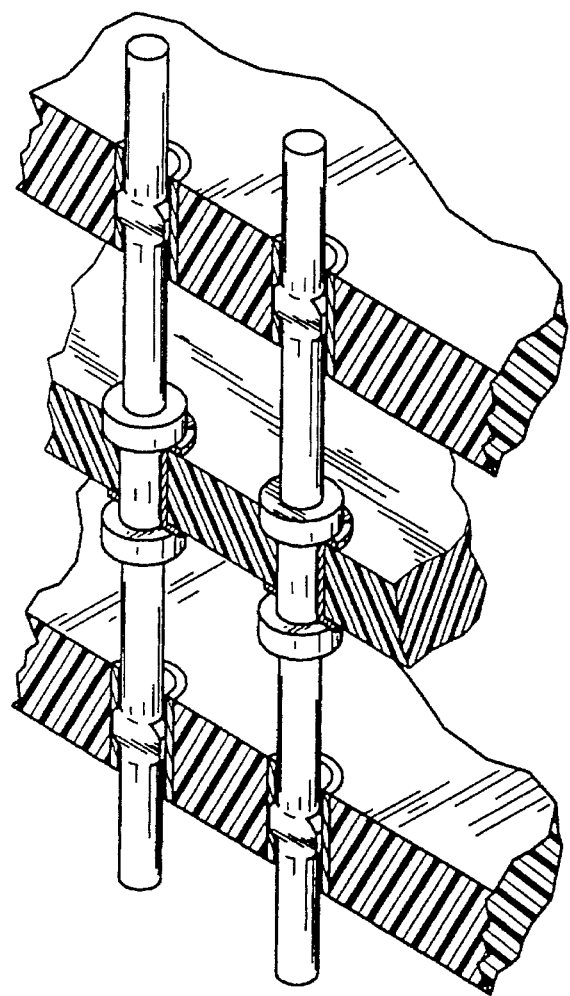

When this embodiment of the invention is employed, there is produced a module as illustrated in FIG. 8, the pins of such module projecting a first array of compliant sections 30 downward from the first surface 18 of the substrate and a second array of compliant sections upward from the second surface 20 of the substrate. Each of these arrays of compliant sections can be firmly affixed to its own printed circuit or other device by compliant pin connection, thereby creating a 3-layered stacked assembly as desired. This is illustrated in FIG. 9.

The present invention can be employed to form printed circuit boards, modules, module assemblies and other devices of any size. Typical circuit boards used today measure 25×25 to 75×75 millimeters and contain an array of 5 to 500 pin/holes, for example. Conventional pin sizes include pins of 16, 18, 20, etc., mils in diameter with the individual pins being spaced apart by any suitable distance, for example 1.27 to 2.54 millimeters. The invention described herein is applicable to printed circuit boards and other electrical devices of any such sizes. In addition, the present invention is also applicable to the production of printed circuit boards and other electrical devices of even larger construction, with the assemblies once formed being subdivided into smaller subassemblies after formation.

Although only a few embodiments of the present invention have been described above, it should be appreciated that many modifications can be made without departing from the spirit and scope of the invention. For example, although lower hammer 36 has been described as being a single, unitary member, it should be appreciated that lower hammer 36 can be composed of a number of different pieces or devices so long as the overall function of the hammer remains the same. For example, hammer 36 could be divided into two or more pieces, one or more pieces arranged to accept and hold the compliant portion 30 of pin blank 14 and another device employed for the application of axial force to end 26 of the pin blank.

Furthermore, although the foregoing has described the holes and openings in the first and second circuit boards as including contacts allowing electrical connection of the pins thereto, it should be appreciated that electrical connections are not always necessary, mechanical connections only being sufficient for some applications.

Furthermore, although the foregoing description indicates that the electrically conductive material 22 in openings 16 form pads 23 on the first and second surfaces of the substrate, it should be appreciated that such pads are not required. In the same way, using pins and pin blanks of circular cross-section is not required, as any cross-sectional shape can be employed. Also, the diameter of the pin blanks used in accordance with the present invention can vary from section to section as desired, it being sufficient in accordance with the present invention merely that hole 34 in hammer 36 (whether formed from single or multiple pieces) receive and accommodate so much of compliant section 30 of the pin as is necessary to accomplish compressive deformation of the pin blank as described above.

In addition, although the foregoing shows using pin blanks with pre-formed compliant sections, it should be appreciated that the pin blanks can be affixed to substrate 12 before the pin blank is swaged or otherwise worked to form compliant sections. This, of course, defeats one of the major advantages of the present invention in using preformed pin blanks for the sake of ease of operation and low cost.

All such modifications are intended to be included within the scope of the present invention, which is to be limited only by the following claims.

We claim:

1. A module comprising
   (1) a substrate defining a first surface, a second surface spaced from said first surface and at least one hole communicating between said first and second surfaces for receiving an electrical connection pin, and
   (2) an electrical connection pin having a substrate-engaging section received in said hole, said substrate-engaging section defining a first bulge engaging said first surface and a second bulge engaging said second surface, said first bulge being formed by compressive deformation while said pin is in said hole so that said first and second bulges securely fasten said pin to said substrate, said pin further defining a first compliant section spaced from said substrate-engaging section and projecting from said first bulge for affixing said pin to a carrier by compliant pin connection, said first compliant section defining at least one protrusion extending outwardly from the central axis of said pin by a distance greater than the radius of the pin in the remainder of the pin body.

2. The module of claim 1 wherein said substrate is composed of a dielectric material, wherein said substrate defines a plurality of holes for receiving respective electrical connection pins and wherein said substrate further defines at least one electrically conductive path therein electrically connected to at least one of said holes, said module further comprising a plurality of electrical connection pins in said holes, with at least one of said pins being electrically connected to said electrically conductive path.

3. The module of claim 2 wherein said substrate defines a plurality of plated-through-holes electrically connected to said electrically conductive path, the surfaces of said plated-through-holes carrying an electrically conductive material for electrical connection to the pins therein.

4. The module of claim 2 wherein said module is a printed circuit board defining a first array of pins each having its own compliant section, said first array of pins projecting from the first surface of said substrate for affixing said module to a first carrier by compliant pin connection.

5. The module of claim 4 wherein at least some of the pins in said module define second compliant sections spaced from their respective substrate-engaging sections, said second compliant sections defining a second array of compliant pin sections projecting from the second surface of said substrate for affixing said second array of compliant pin sections to a second carrier by compliant pin connection.

6. The module of claim 5, wherein each of said first and second compliant sections define at least one protrusion extending outwardly from the central axis of said pin.

7. The module of claim 4 wherein compliant pin sections for attachment to a carrier project from one side of said substrate only.

8. An assembly comprising the module of claim 1 affixed to a first carrier, said carrier defining at least one opening having a size compatible with the compliant section of at least one pin of said module, said compliant pin section of said at least one pin being inserted into said opening and coacting with the walls of said opening so that said at least one pin is securely affixed to said carrier.

9. The assembly of claim 8 wherein said module comprises a first printed circuit board defining a first array of pins each having its own compliant section, said first array of pins projecting from the first surface of said substrate for affixing said module to said first carrier, said carrier comprising a second printed circuit board defining a plurality of openings therein corresponding to the pins in said first array of pins, the compliant sections of said first array of pins being inserted into and securely fixed to the respective openings in said second printed circuit board.

10. The module of claim 7 wherein the holes in said first printed circuit board and the openings in said second printed circuit board are plated-through holes.

11. The module of claim 1, wherein said substrate defines a plurality of said holes and further wherein said module includes a plurality of said electrical connection pins.

* * * * *